(12) United States Patent
Yoneya

(10) Patent No.: US 7,161,437 B2  
(45) Date of Patent: Jan. 9, 2007

(54) VOLTAGE-CONTROLLED OSCILLATOR AND QUADRATURE MODULATOR

(75) Inventor: Akihiko Yoneya, Aichi (JP)

(73) Assignee: Nagoya Industrial Science Research Institute, Nagoya (JP)

(*) Notice: Subject to any disclaimer, the term of this patent is extended or adjusted under 35 U.S.C. 154(b) by 9 days.

(21) Appl. No.: 10/521,099

(22) PCT Filed: Aug. 19, 2003

(86) PCT No.: PCT/JP03/10472  
§ 371 (c)(1),  
(2), (4) Date: Jan. 13, 2005

(87) PCT Pub. No.: WO2004/021570  
PCT Pub. Date: Mar. 11, 2004

(65) Prior Publication Data  
US 2005/0225400 A1 Oct. 13, 2005

(30) Foreign Application Priority Data  
Aug. 30, 2002 (JP) ............................. 2002-254031

(51) Int. Cl.  
H03B 27/00 (2006.01)

(52) U.S. Cl. ............... 331/57; 331/1 A; 331/45; 331/50; 332/104

(58) Field of Classification Search ............. 331/57, 331/117 FE  
See application file for complete search history.

(56) References Cited

U.S. PATENT DOCUMENTS 5,561,398 A * 10/1996 Rasmussen ............... 331/36 C  
5,596,302 A    1/1997 Mastrocola et al.  
5,668,505 A    9/1997 Vu et al.  
6,724,267 B1 * 4/2004 Kim .......................... 331/57

FOREIGN PATENT DOCUMENTS

JP  09-246865  9/1997

* cited by examiner

Primary Examiner—Arnold Kinkead  
(74) Attorney, Agent, or Firm—Oblon, Spivak, McClelland, Maier & Neustadt, P.C.

(57) ABSTRACT

A ring oscillator of an even number of stages of inverting/summing amplifiers that adds, to an input of each of the amplifiers, a signal from one such of the amplifiers as to be distant by an even number of stages therefrom, to realize a desired oscillation operation, thereby directly generating signals having phases shifted by 90 degrees from each other. Further, the signals in the ring oscillator are complementary to each other, so that by arranging these signals close to each other in a wiring, it is possible to realize low sensitivity to a mixed external signal.

12 Claims, 5 Drawing Sheets

VOLTAGE-CONTROLLED OSCILLATOR AND QUADRATURE MODULATOR

TECHNICAL FIELD

The present invention relates to a voltage controlled oscillator by use of a ring oscillator and a quadrature modulator for performing modulation by use of signals that have phases shifted by 90 degrees from each other. It is to be noted that the voltage controlled oscillator refers to an oscillator for oscillating frequency that continuously changes in accordance with value of a control signal; although the control signal is not limited to a voltage signal, a name of "voltage controlled oscillator" is used in this description according to customary usage.

BACKGROUND ART

A conventional ring oscillator has a problem that phase noise is liable to become large due to an effect of a mixed signal from an outside because internal signals are not complementary to each other in a configuration that an odd number of inverting amplifiers are connected in a ring in a case where this oscillator does not employ differential amplifiers. Further, use of differential amplifiers decreases effects of the mixed signal from the outside but, at the same time, increases phase noise due to thermal noise, problematically.

In a conventional quadrature modulator, to obtain modulation signals orthogonal to each other, it has conventionally been performed to shift a phase of a modulation input by 90 degrees by using a phase shifter so that signals whose phases are shifted by 90 degrees from each other may be obtained or to divide a frequency of the modulation input so that the signals whose phases are shifted by 90 degrees from each other may be obtained.

In a method for shifting the phase by 90 degrees by using a phase shifter, in order to shift the phase by 90 degrees accurately, it is necessary to improve a precision of components of the phase shifter or adjust the phase shifter by trimming or perform automatic calibration on the phase shifter. However, an approach for improving the precision of the components of the phase shifter has a problem that it is difficult to implement in an IC and not cost effective. An approach for trimming the phase shifter has a problem that trimming involved is expensive. An approach for automatic calibration of the phase shifter has a problem of an increase in costs because it needs to have means for detecting a shift in phase by the phase shifter accurately and means for automatic calibration.

In a method for dividing a frequency of a modulation input to obtain modulation signals having phases shifted by 90 degrees from each other, a modulation input signal having a higher frequency than that of the modulation signals is required, so that in particular when the modulation frequency is high, it is necessary to use a device that can follow this high frequency and generate a high-frequency modulation input, which increases costs or power dissipation, problematically.

As for a voltage controlled oscillator, on the other hand, a method, among others, of using a ring oscillator needs to use an even number of stages of ring oscillators in order to directly provide signals having phases shifted by 90 degrees from each other, in which an even number of differential amplifiers have been connected in a ring. Since the differential amplifiers have been used, phase noise of the ring oscillator has become even larger.

The present invention implements two objects of (1) realizing a ring oscillator that has comparatively small phase noise and is not so affected by a mixed signal from an outside and (2) obtaining modulation signals having phases shifted by 90 degrees from each other accurately in order to realize an accurate quadrature modulator.

DISCLOSURE OF THE INVENTION

A first feature of the present invention is a voltage controlled oscillator for outputting a signal whose frequency changes in accordance with a value of a control signal, the oscillator comprising an even number of, at least four, amplifiers each of which has a first input and a second input, wherein gain from the first input to its output and that from the second input to its output are both of a negative value, signal propagation delay time from the first input to its output and that from the second input to its output change in accordance with a value of the control signal, and each of the first inputs of these amplifiers is connected to the output of the next one of the amplifiers so that they may be formed in a ring and each of the second inputs of the amplifiers is connected to the output of such one of the amplifiers as to be distant by an even number of stages therefrom.

A second feature of the present invention is a voltage controlled oscillator for outputting a signal whose frequency changes in accordance with a value of a control signal, in which an even number of equivalent amplifiers are connected in a ring, each of the amplifiers has a small-signal transfer function containing at least one unstable zero, direct-current gain of less than one in absolute value, and phase characteristics change in accordance with the value of the control signal.

The present invention can realize the above two objects by constituting a ring oscillator of an even number of single-output amplifiers. That is, in contract to a conventional technology by which no signal can be oscillated if an even number of stages of single-output amplifiers are connected in a ring, according to the present invention it is possible to operate a ring oscillator by using a method of either (1) providing two-input amplifiers in such a configuration that their respective input signals may be outputs of the two amplifiers that are each distant by an odd number of stages therefrom or (2) providing each of the amplifiers with an unstable zero (i.e., zero having positive real part).

If a ring oscillator is provided with an even number of stages of amplifiers, oscillated signals are complementary to each other, so that by arranging these signals close to each other in wiring, it is possible to mitigate an effect of a mixed signal from an outside on an oscillation frequency. That is, phase noise due to the mixed signal from the outside can be suppressed.

As means for suppressing the phase noise in a ring oscillator, such is known as to provide the ring oscillator not with differential type amplifiers but with single-output type amplifiers so that phase noise due to thermal noise can be suppressed. Further, it can have larger amplitude in oscillation than the differential amplifier type and so is all the more advantageous in suppression of the phase noise.

A third feature of the present invention is a quadrature modulator with a modulation frequency input and a modulation-subject signal input, for modulating a signal applied to the modulation-subject signal input by using modulation signals having phases shifted by 90 degrees from each other at a frequency obtained by multiplying a frequency of a modulation frequency signal by a specified multiple, which is a predetermined rational number, the quadrature modulator comprising a voltage controlled oscillator according to claim 1, 2, 3, or 4 for generating the modulation signals having their phases shifted by 90 degrees from each other, means for modulating the modulation-subject signal by using the modulation signals, and means for equalizing a ratio between a frequency of the modulation signals and that of the modulation frequency input to the specified multiple.

A fourth feature of the present invention is a quadrature modulator with a reference frequency input, a modulation-subject signal input, and a modulation frequency specification input, for modulating a signal applied to the modulation-subject signal input by using modulation signals having phases shifted by 90 degrees from each other at a frequency equal to a frequency obtained by multiplying a frequency of the reference frequency input by a value specified by the modulation frequency specification input, the quadrature modulator comprising a voltage controlled oscillator according to claim 1, 2, 3, or 4 for generating the modulation signals having phases shifted by 90 degrees from each other, means for modulating the modulation-subject signal by using the modulation signals, and means for equalizing a ratio between a frequency of the modulation signals and that of the reference frequency input to the value specified by the modulation frequency specification input.

As described above, by providing ring oscillator stages as many as a multiple of four because an even number is allowed as the number of the stages, it is possible to directly obtain oscillation outputs whose phases are shifted by 90 degrees from each other, thus facilitating quadrature modulation. Further, in such a quadrature modulator among other modulators as to double a frequency of a carrier signal, which requires signals having phases shifted by 45 degrees from each other, those signals whose phases are shifted by 45 degrees from each other can be obtained by providing eight ring oscillator stages in it.

As describes above, the present invention enables building a ring oscillator that is not easily affected by a mixed signal from the outside and has small phase noise. Further, it is possible to easily obtain signals having phases shifted by 90 degrees from each other, thereby constituting a quadrature modulator accurately.

BEST MODE FOR CARRYING OUT THE INVENTION

Figure 1:
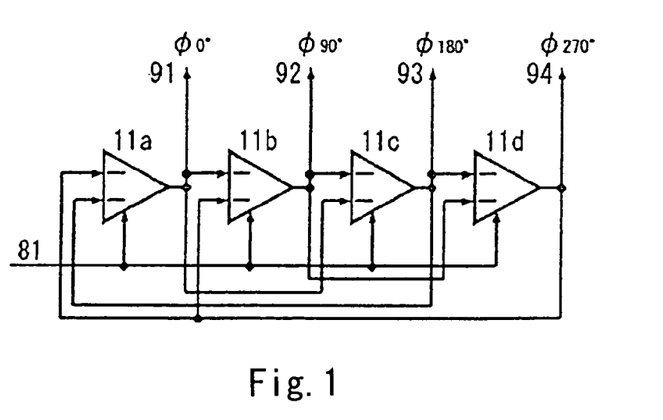
FIG. 1 is a block diagram for showing a first embodiment of the present invention.

FIG. 1 shows a voltage controlled oscillator according to a first embodiment of the present invention. It provides oscillation outputs having phases of 0, 90, 180, and 270 degrees. Variable-delay inverting/summing amplifiers 11a, 11b, 11c, and 11d each have delay time in signal propagation that changes with a value of a control signal 81 for the voltage controlled oscillator.

If gain over a first input and that over a second input of each of the variable-delay inverting/summing amplifiers 11a, 11b, 11c, and 11d are equal to each other and these amplifiers have the same characteristics, this oscillator oscillates at such a frequency that those amplifiers may each give a phase delay of 45 degrees.

The voltage controlled oscillator does not operate in a bistable manner because the amplifiers each operate as an inverting amplifier and receive, as its inputs, outputs of the two amplifiers that are each distant by an odd number of stages therefrom.

Figure 2:
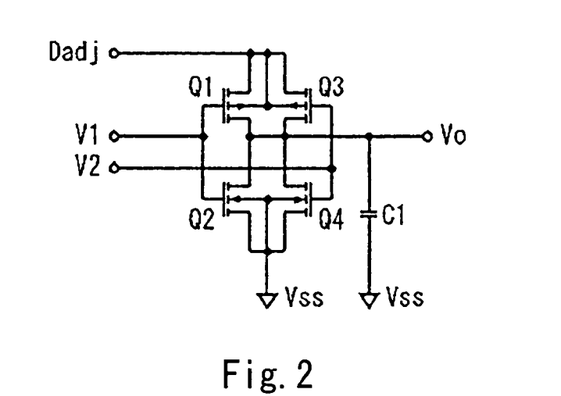
FIG. 2 is a circuit diagram for showing a first implementation of a variable-delay inverting/summing amplifier.

FIG. 2 shows a first implementation of the variable-delay inverting/summing amplifiers 11a, 11b, 11c, and 11d in the voltage controlled oscillator according to the first embodiment of the present invention. The amplifiers are each constituted of two p-channel FETs Q1 and Q3, two n-channel FETs Q2 and Q4, and a load capacitor C1. A delay time control input Dadj for the variable-delay inverting/summing amplifiers provides a power supply voltage for them.

By short-circuiting an output of a one-input, one-output inverting amplifier constituted of Q1 and Q2 and that of a one-input, one-output inverting amplifier constituted of Q3 and Q4 to each other, values corresponding to outputs of these two amplifiers are averaged and output. As a value of the delay time control input Dadj that provides the power supply voltage changes, a drive capacity of Q1, Q2, Q3, and Q4 changes to change the delay time of the amplifiers, thereby changing an oscillation frequency of the oscillator correspondingly.

Since the variable-delay inverting/summing amplifiers 11a, 11b, 11c, and 11d according to the first implementation are each constituted of the complementary FETs, it is expected that spurious response of an oscillation output signal owing to 1/f noise can be suppressed.

Figure 3:
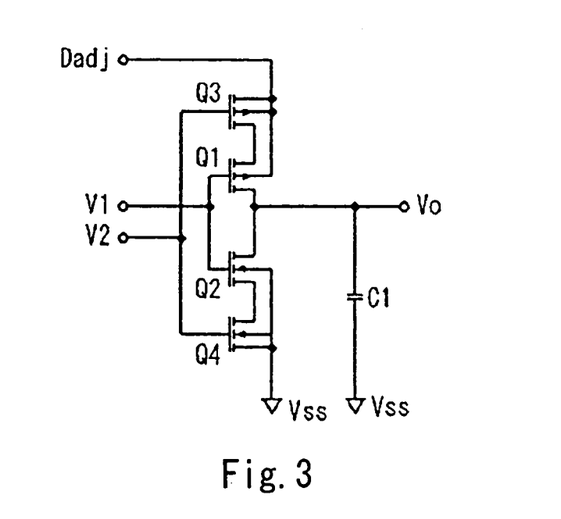
FIG. 3 is a circuit diagram for showing a second implementation of the variable-delay inverting/summing amplifier.

FIG. 3 shows a second implementation of the variable-delay inverting/summing amplifiers 11a, 11b, 11c, and 11d in the voltage controlled oscillator according to the first embodiment of the present invention. The amplifiers are each constituted of two p-channel FETs Q1 and Q3, two n-channel FETs Q2 and Q4, and a load capacitor C1. A delay time control input Dadj for the variable-delay inverting/summing amplifiers provides a power supply voltage for them.

In each of the amplifiers according to the second implementation, the FETs are serially connected to constitute a summing amplifier circuit, thereby enabling saving on power as compared to the amplifier of the first implementation shown in FIG. 2. However, to cause the oscillator to operate in a desired manner, care must be taken so that gain over an input V1 and that over an input V2 may match to some extent.

Figure 4:
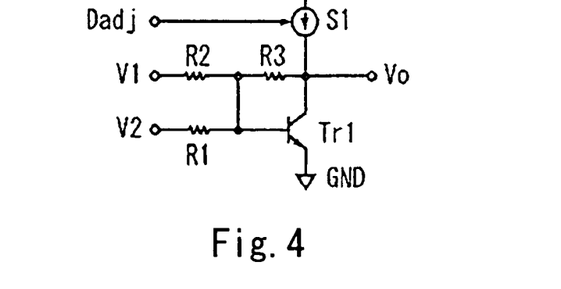
FIG. 4 is a circuit diagram for showing a third implementation of the variable-delay inverting/summing amplifier.

FIG. 4 shows a third implementation of the variable-delay inverting/summing amplifiers 11a, 11b, 11c, and 11d in the voltage controlled oscillator according to the first embodiment of the present invention. The amplifiers are each constituted of an Si bipolar transistor Tr1, resistors R1, R2, and R3, and a variable constant current source S1. A value of a delay time control input Dadj for the variable-delay inverting/summing amplifiers determines a current to be supplied by the variable constant current source S1.

As the value of the delay time control input Dadj changes, a collector current in the Si bipolar transistor Tr1 changes. Correspondingly, electrostatic capacitance between a collector and a base of the Si bipolar transistor Tr1 changes. Since this collector-base electrostatic capacitance of the Si bipolar transistor Tr1 and resistance of the resistor R3 are combined to give first-order delay, eventually a change in value of the delay time control input Dadj causes a change in delay time of the amplifier and therefore a change in oscillation frequency of the oscillator.

Although in the first embodiment of the present invention, the four stages of amplifiers have been connected in a ring, the number of the amplifier stages is not limited to four as far as it is an even number not less than four.

Figure 5:
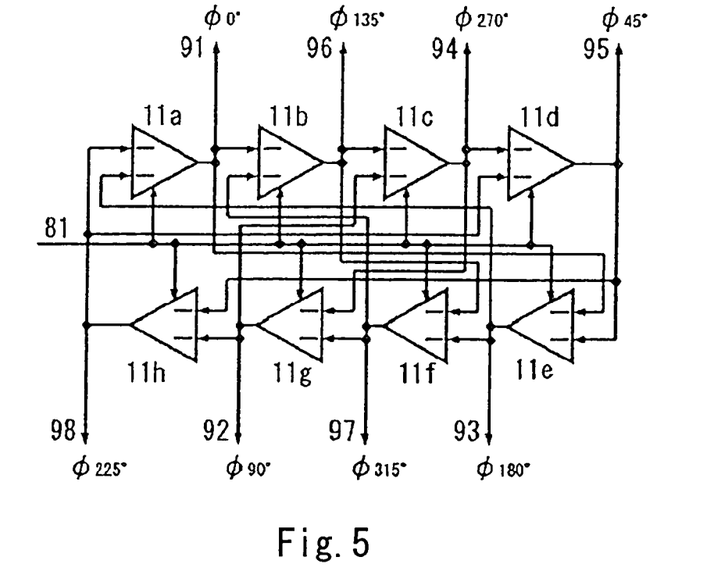
FIG. 5 is a block diagram for showing a second embodiment of the present invention.

FIG. 5 shows a voltage controlled oscillator according to a second embodiment of the present invention. It oscillates outputs having phases of 0, 45, 90, 135, 180, 225, 270, and 315 degrees. Variable-delay inverting/summing amplifiers 11a, 11b, 11c, 11d, 11e, 11f, 11g, and 11h each have delay time in signal propagation that changes with a value of a control signal 81 for the voltage controlled oscillator.

If gain over a first input and that over a second input of each of the variable-delay inverting/summing amplifiers 11a, 11b, 11c, 11d, 11e, 11f, 11g, and 11h are equal to each other and these amplifiers have the same characteristics, this oscillator oscillates at such a frequency that those amplifiers may each give a phase delay of 67.5 degrees.

The voltage controlled oscillator does not operate in a bistable manner because the amplifiers each operate as an inverting amplifier and receive, as its inputs, outputs of the two amplifiers that are each distant by an odd number of stages therefrom. Although each of those amplifiers receives, as its input signals, an output of the previous amplifier stage and that of the fourth preceding amplifier stage, the connection in wiring may be changed in some cases so that the phase difference obtained between the oscillation outputs would be 90 degrees, not 45 degrees.

The variable-delay inverting/summing amplifiers 11a, 11b, 11c, 11d, 11e, 11f, 11g, and 11h in the voltage controlled oscillator according to the second embodiment of the present invention may be implemented as shown in FIGS. 2, 3, and 4.

Figure 6:
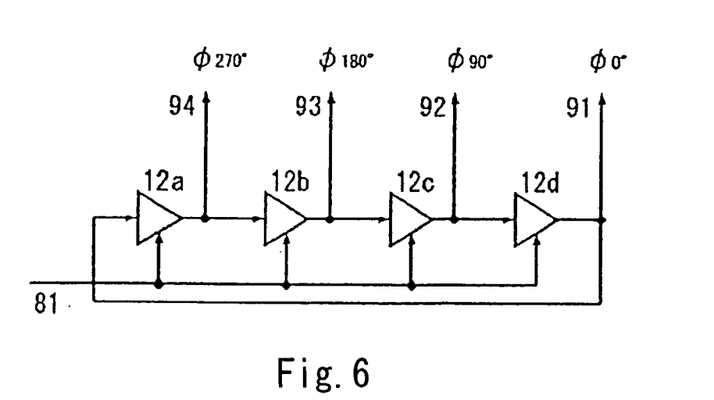
FIG. 6 is a block diagram for showing a third embodiment of the present invention.

FIG. 6 shows a multiphase-output voltage controlled oscillator according to a third embodiment of the present invention. It provides oscillation outputs having phases of 0, 90, 180, and 270 degrees.

The voltage controlled oscillator has such a configuration that four variable-delay non-minimum phase amplifiers 12a, 12b, 12c, and 12d are connected in a ring and that a control signal 81 for this oscillator provides a delay control input to the four variable-delay non-minimum phase amplifiers 12a, 12b, 12c, and 12d.

The variable-delay non-minimum phase amplifiers 12a, 12b, 12c, and 12d have uniform characteristics in that they have an absolute number of DC gain of less than one, that they have an absolute number of gain at an oscillation frequency of more than one, and that their transfer functions each contain a zero having a positive real part (unstable zero). Since the transfer function of each of the variable-delay non-minimum phase amplifiers 12a, 12b, 12c, and 12d has an unstable zero, a circuit shown in FIG. 6 can be operated as a ring oscillator.

Since the four stages of the variable-delay non-minimum phase amplifiers 12a, 12b, 12c, and 12d are connected in a ring, a signal passing through these four stages of the variable-delay non-minimum phase amplifiers 12a, 12b, 12c, and 12d has a phase delay of 360 degrees. Therefore, each stage of the amplifiers gives a phase delay of 90 degrees. That is, it oscillates at such a frequency that those amplifiers may each give a phase delay of 90 degrees. Since the delay of the variable-delay non-minimum phase amplifiers 12a, 12b, 12c, and 12d is controlled by the control signal 81, the oscillation frequency of this voltage controlled oscillator is controlled by a value of the control signal 81.

According to the third embodiment of the present invention, by providing the uniform characteristics to the four variable-delay non-minimum phase amplifiers 12a, 12b, 12c, and 12d, it is possible to easily obtain oscillation outputs that have a phase difference of 90 degrees accurately from each other.

However, if dynamic characteristics of the variable-delay non-minimum phase amplifiers 12a, 12b, 12c, and 12d are not set properly, the oscillator does not operate so that the amplifier stages may have a phase delay of 90 degrees with respect to each other. To provide a phase delay of 90 degrees through each of the stages, the dynamic characteristics of the variable-delay non-minimum phase amplifiers 12a, 12b, 12c, and 12d can be set in accordance with a combination of the transfer function and a saturation element as given in the following Equation 1, for example:

$$G(s) = \frac{-2as + 0.95}{(as)^2 + 2as + 1} \qquad \text{Equation 1}$$

However, "a" (a>0) in Equation 1 is a parameter related to delay in the variable-delay non-minimum phase amplifiers 12a, 12b, 12c, and 12d and changes in value with the control signal from the outside. In this case, the zero of this transfer function is given by 0.475×a, which has a positive real part, and so is an unstable zero. Therefore, the amplifiers are of a non-minimum phase.

Figure 7:
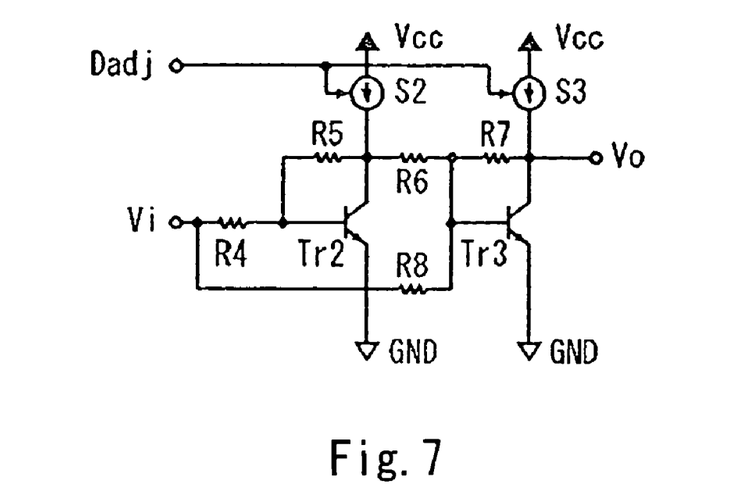
FIG. 7 is a circuit diagram for showing a circuit example of a variable-delay non-minimum phase amplifier in the third embodiment of the present invention.

FIG. 7 shows one implementation of the variable-delay non-minimum phase amplifiers 12a, 12b, 12c, and 12d in the third embodiment of the present invention. In general, by constituting each amplifier of two stages of inverting amplifiers in such a configuration that an input to the first stage of inverting amplifier may be provided as an input of the amplifier and arranging the second stage of the inverting amplifier as a summing amplifier for the input of the amplifier and an output of the first stage of the amplifier, it is possible to give an unstable zero to a transfer function of that amplifier so that it may be of a non-minimum phase. By setting resistance values of resistors R4, R5, R6, and R7 in FIG. 7 to proper values, the amplifier can be provided with such a transfer function as given in Equation 1.

The implementation of the variable-delay non-minimum phase amplifiers 12a, 12b, 12c, and 12d in the third embodiment of the present invention is not limited to such as shown in FIG. 7 but may be in accordance with any other method. Further, the transfer function of the variable-delay non-minimum phase amplifiers 12a, 12b, 12c, and 12d in the third embodiment of the present invention is not limited to such as given in Equation 1 but may be of any other form.

Although in the third embodiment of the present invention, the four stages of amplifiers have been connected in a ring, the number of the stages of amplifiers is not limited to four but arbitrary.

Although in the third embodiment of the present invention, a non-inverting amplifier has been used as the variable-delay non-minimum phase amplifiers 12a, 12b, 12c, and 12d, an inverting amplifier may be employed instead. In this case, for example, desired operations can be performed by using such an inverting amplifier as to have dynamic characteristics that combine a saturation element and a transfer function obtained by multiplying the transfer function of Equation 1 by −1.

Figure 8:
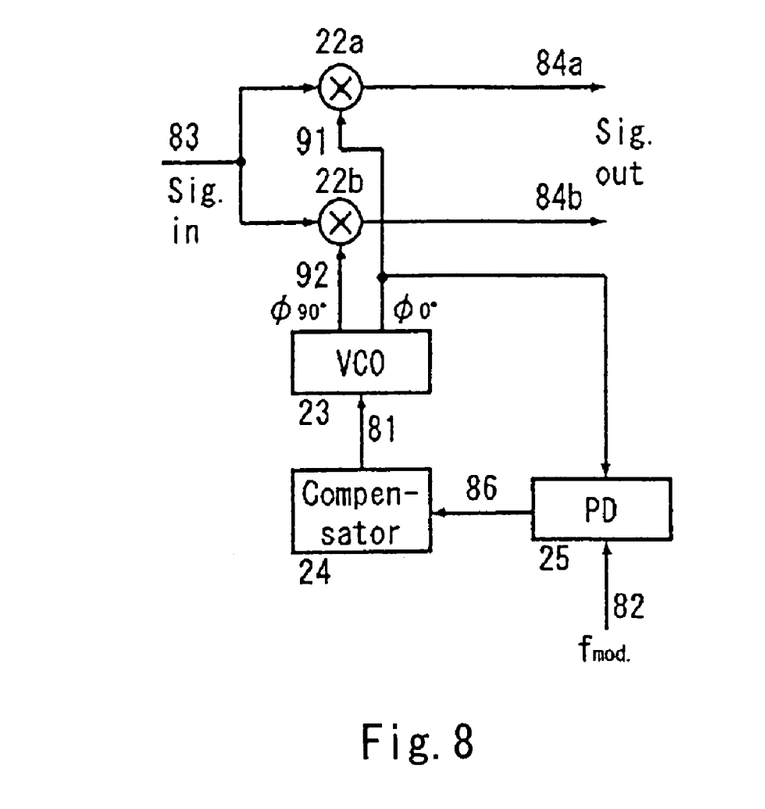
FIG. 8 is a block diagram for showing a fourth embodiment of the present invention.

FIG. 8 shows a quadrature modulator according to a fourth embodiment of the present invention. This modulator modulates one modulation-subject signal 83 by using signals that have the same frequency as that of the modulation frequency signal 82 and phases shifted by 90 degrees from each other, to obtain two modulated output signals 84a and 84b respectively. It can be used as quadrature demodulator in a receiver.

A voltage controlled oscillator 23, which is of a multiphase output in accordance with the present invention, outputs signals 91 and 92 having phases shifted by 90 degrees from each other, at a frequency in accordance with a value of a control signal 81. A phase detector 25 detects a phase difference between the oscillation output signal 91 of the voltage controlled oscillator 23 and the modulation frequency signal 82, to output a signal in accordance with this phase difference, as a phase comparison output signal 86. A compensator 24 assures stability and performance of a PLL constituted of the voltage controlled oscillator 23, the compensator 24, and the phase detector 25.

The PLL constituted of the voltage controlled oscillator 23, the compensator 24, and the phase detector 25 controls the voltage controlled oscillator 23 so that it may output the signals 91 and 92 that have the same frequency as that of the modulation frequency signal 82. The modulation-subject signal 83 is modulated by modulators 22a and 22b by using the two-phase oscillation output signals 91 and 92 of the voltage controlled oscillator 23, to provide modulation output signals 84a and 84b respectively.

Since the two-phase oscillation output signals 91 and 92 of the voltage controlled oscillator 23 are shifted in phase by 90 degrees from each other accurately, it is possible to modulate the modulation-subject signal 83 by using the signals that have the same frequency as the modulation frequency signal 82 and are orthogonal to each other accurately, to provide the modulation output signals 84a and 84b.

In this quadrature modulator, the PLL can have a wide loop bandwidth, so that the circuit can be simplified by, for example, employing the multiplication type as phase detector 25.

Although in the fourth embodiment of the present invention the output of the voltage controlled oscillator 23 has been applied directly to the phase detector 25, a frequency divider having a fixed frequency division ratio may be inserted between them. Further, although in the fourth embodiment of the present invention, the modulation frequency signal 82 has been input directly to the phase detector 25, a frequency divider having a fixed frequency division ratio may be inserted between them.

Figure 9:
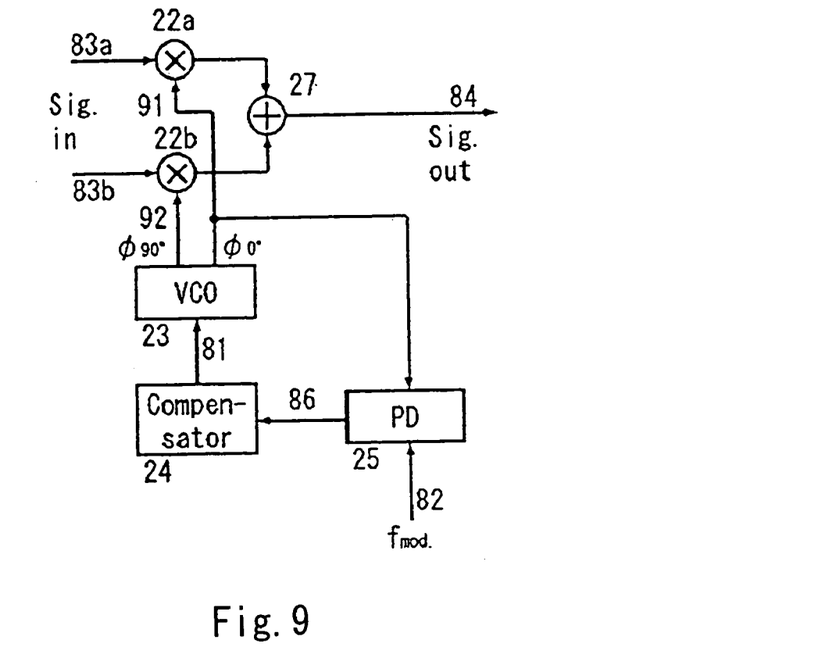
FIG. 9 is a block diagram for showing a fifth embodiment of the present invention.

FIG. 9 shows a quadrature modulator according to a fifth embodiment of the present invention. This modulator modulates two modulation-subject signals 83a and 83b by using signals that have the same frequency as that of the modulation frequency signal 82 and phases shifted by 90 degrees from each other and combines these signals by using an adder 27, to obtain one modulation output signal 84. It can be used as quadrature modulator in a transmitter. Operations of the fifth embodiment of the present invention are the same as those of the fourth embodiment of the present invention except for the number of the modulation-subject signals and that of the modulation output signals.

Figure 10:
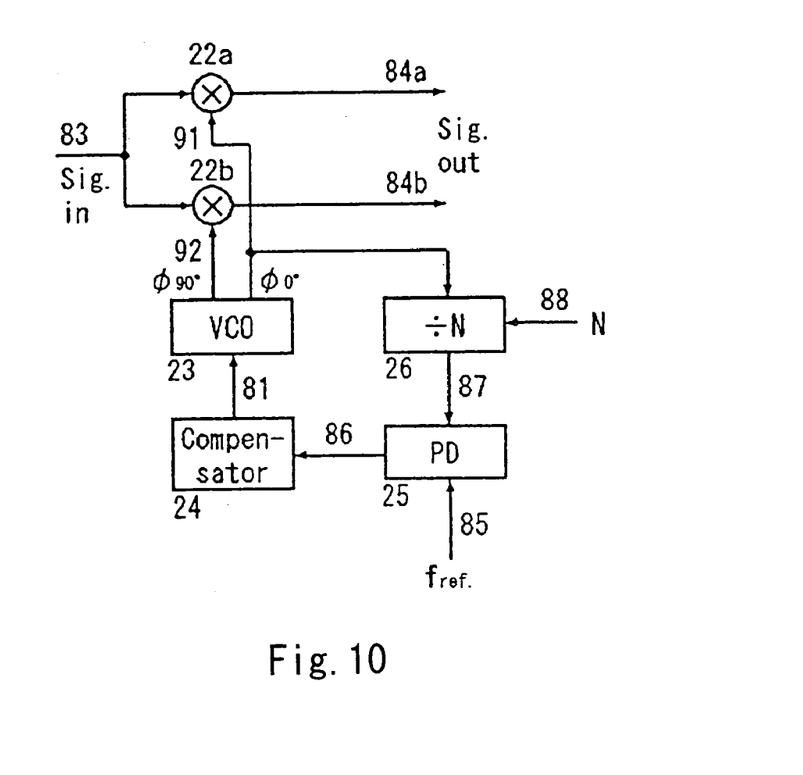
FIG. 10 is a block diagram for showing a sixth embodiment of the present invention.

FIG. 10 shows a quadrature modulator according to a sixth embodiment of the present invention. This modulator modulates a modulation-subject signals 83 by using signals that have a frequency obtained by multiplying a frequency of a reference frequency signal 85 by a value specified by a frequency dividing number set signal 88 and that have phases shifted by 90 degrees from each other, to obtain two modulation output signals 84a and 84b respectively.

A voltage controlled oscillator 23, which is of a multiphase output in accordance with the present invention, outputs signals 91 and 92 having phases shifted by 90 degrees from each other, at a frequency in accordance with a value of a control signal 81. A programmable frequency divider 26 divides a frequency of the output signal 91 of the voltage controlled oscillator 23 by a value specified by the frequency dividing number set signal 88, to provide a frequency division output signal 87. A phase detector 25 detects a phase difference between the frequency division output signal 87, which is an output of the programmable frequency divider 26, and the reference frequency signal 85, to output a signal in accordance with this phase difference, as a phase comparison output signal 86. A compensator 24 assures stability and performance of a PLL constituted of the voltage controlled oscillator 23, the compensator 24, the phase detector 25, and the programmable frequency divider 26.

The PLL constituted of the voltage controlled oscillator 23, the compensator 24, the phase detector 25, and the programmable frequency divider 26 controls the voltage controlled oscillator 23 so that it may output the signals 91 and 92 that have a frequency obtained by multiplying the frequency of the reference frequency signal 85 by a value specified by the frequency dividing number set signal 88. The modulation-subject signal 83 is modulated by modulators 22a and 22b by using the two-phase oscillation output signals 91 and 92 of the voltage controlled oscillator 23, to provide modulation output signals 84a and 84b respectively.

Since the two-phase oscillation output signals 91 and 92 of the voltage controlled oscillator 23 are shifted in phase by 90 degrees from each other accurately, it is possible to modulate the modulation-subject signal 83 by using the signals orthogonal to each other accurately, at a frequency obtained by multiplying the frequency of the reference frequency signal 85 by a value specified by the frequency dividing number specify signal 88, thereby obtaining the modulation output signals 84a and 84b.

Although in the sixth embodiment of the present invention a frequency dividing number used by the programmable frequency divider 26 has been input from an outside as the frequency dividing number set signal 88, the frequency dividing number used by the frequency divider may be fixed. Further, the frequency dividing number, which is an integer, may be changed for each period to provide a rational number essentially.

Figure 11:
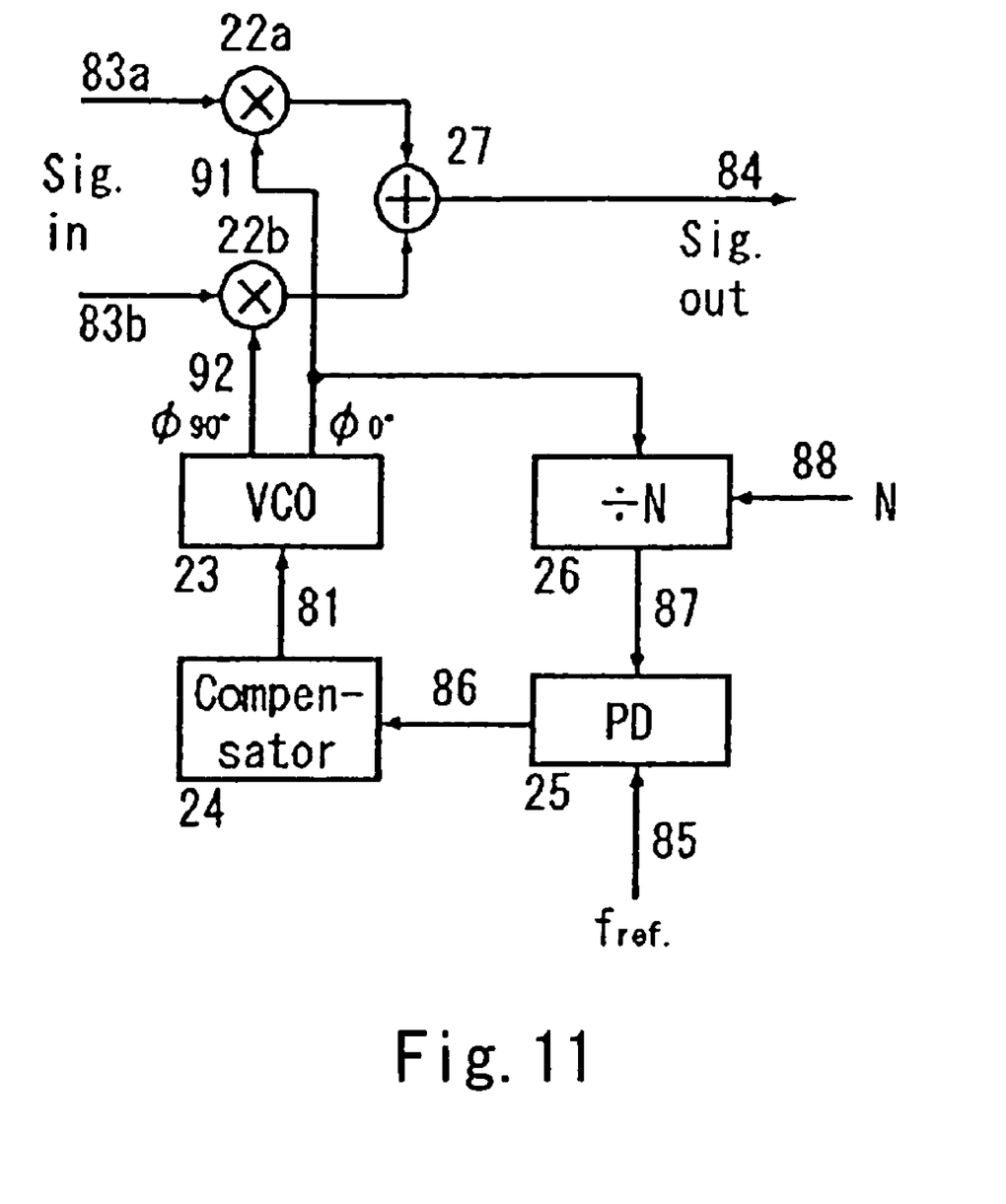
FIG. 11 is a block diagram for showing a seventh embodiment of the present invention.

FIG. 11 shows a quadrature modulator according to a seventh embodiment of the present invention. This modulator modulates two modulation-subject signals 83a and 83b by using signals that have the same frequency as that of the modulation frequency signal 82 and phases shifted by 90 degrees from each other and combines these signals by using an adder 27, to obtain one modulation output signal 84. It can be used as quadrature modulator in a receiver. Operations of the seventh embodiment of the present invention are the same as those of the sixth embodiment of the present invention except for the number of the modulation-subject signals and that of the modulation output signals.

PROBABILITY OF UTILIZED INDUSTRIALIZATION

As described above, a voltage controlled oscillator related to the present invention has small phase noise and is not so affected by a mixed signal from an outside and can provide signals having phases shifted by 90 degrees from each other accurately, thus qualifying itself for use particularly in easily constituting a quadrature modulator with high precision.

The invention claimed is:

1. A voltage controlled oscillator for outputting a signal whose frequency changes in accordance with a value of a control signal, wherein:
    the oscillator has an even number of, at least four, amplifiers;
    each amplifier is a non-differential input type and has a first input and a second input and a single-ended output, a gain from the first input to its output and that from the second input to its output both having a negative value, and a signal propagation delay time from the first input to its output and that from the second input to its output changing in accordance with a value of the control signal;
    each of the first inputs of the amplifiers is connected to one of the outputs of another one of the amplifiers so that they may be formed in a ring; and
    each of the second inputs of the amplifiers is connected to one of the outputs of such one of the amplifiers as to be distant by an even number of stages therefrom.

2. A voltage controlled oscillator for outputting a signal whose frequency changes in accordance with a value of a control signal, wherein:
    the oscillator has first, second, third, and fourth amplifiers;
    the first, second, third, and fourth amplifiers each have a first input and a second input, gain from the first input to its output and that from the second input to its output both having a negative value, and signal propagation delay time from the first input to its output and that from the second input to its output changing in accordance with a value of the control signal; and
    the output of the first amplifier is connected to the first input of the second amplifier and the second input of the third amplifier, the output of the second amplifier is connected to the first input of the third amplifier and the second input of the fourth amplifier, the output of the third amplifier is connected to the first input of the fourth amplifier and the second input of the first amplifier, and the output of the fourth amplifier is connected to the first input of the first amplifier and the second input of the second amplifier.

3. A voltage controlled oscillator for outputting a signal whose frequency changes in accordance with a value of a control signal, wherein:
    the oscillator has first, second, third, fourth, fifth, sixth, seventh, and eighth amplifiers;
    the first, second, third, fourth, fifth, sixth, seventh, and eighth amplifiers each have a first input and a second input, gain from the first input to its output and that from the second input to its output both having a negative value, and signal propagation delay time from the first input to its output and that from the second input to its output changing in accordance with a value of the control signal; and
    the output of the first amplifier is connected to the first input of the second amplifier and the second input of the fifth amplifier, the output of the second amplifier is connected to the first input of the third amplifier and the second input of the sixth amplifier, the output of the third amplifier is connected to the first input of the fourth amplifier and the second input of the seventh amplifier, the output of the fourth amplifier is connected to the first input of the fifth amplifier and the second input of the eighth amplifier, the output of the fifth amplifier is connected to the first input of the sixth amplifier and the second input of the first amplifier, the output of the sixth amplifier is connected to the first input of the seventh amplifier and the second input of the second amplifier, the output of the seventh amplifier is connected to the first input of the eighth amplifier and the second input of the third amplifier, and the output of the eighth amplifier is connected to the first input of the first amplifier and the second input of the fourth amplifier.

4. A voltage controlled oscillator for outputting a signal whose frequency changes in accordance with a value of a control signal, wherein:
    an even number of equivalent amplifiers are connected in a ring; and
    each of the amplifiers has a minute-signal transfer function containing at least one unstable zero, whose direct-current gain is less than one in absolute value and whose phase characteristic changes in accordance with the value of the control signal.

5. A quadrature modulator with a modulation frequency input and a modulation-subject signal input, for modulating a signal applied to the modulation-subject signal input by using modulation signals having phases shifted by 90 degrees from each other, at a frequency obtained by multiplying a frequency of a modulation frequency signal by a specified multiple, which is a predetermined rational number, the quadrature modulator comprising:
    a voltage controlled oscillator according to claim 1, for generating the modulation signals having their phases shifted by 90 degrees from each other;
    means for modulating the modulation-subject signal by using the modulation signals; and
    means for equalizing a ratio between a frequency of the modulation signals and that of the modulation frequency input to the specified multiple.

6. A quadrature modulator with a reference frequency input, a modulation-subject signal input, and a modulation frequency specification input, for modulating a signal applied to the modulation-subject signal input by using modulation signals having phases shifted by 90 degrees from each other, at a frequency equal to a frequency obtained by multiplying a frequency of the reference frequency input by a value specified by the modulation frequency specification input, the quadrature modulator comprising:
    a voltage controlled oscillator according to claim 1, for generating the modulation signals having phases shifted by 90 degrees from each other;
    means for modulating the modulation-subject signal by using the modulation signals; and means for equalizing a ratio between a frequency of the modulation signals and that of the reference frequency input to the value specified by the modulation frequency specification input.

7. A quadrature modulator with a modulation frequency input and a modulation-subject signal input, for modulating a signal applied to the modulation-subject signal input by using modulation signals having phases shifted by 90 degrees from each other, at a frequency obtained by multiplying a frequency of a modulation frequency signal by a specified multiple, which is a predetermined rational number, the quadrature modulator comprising:
    a voltage controlled oscillator according to claim 2, for generating the modulation signals having their phases shifted by 90 degrees from each other;
    means for modulating the modulation-subject signal by using the modulation signals; and
    means for equalizing a ratio between a frequency of the modulation signals and that of the modulation frequency input to the specified multiple.

8. A quadrature modulator with a modulation frequency input and a modulation-subject signal input, for modulating a signal applied to the modulation-subject signal input by using modulation signals having phases shifted by 90 degrees from each other, at a frequency obtained by multiplying a frequency of a modulation frequency signal by a specified multiple, which is a predetermined rational number, the quadrature modulator comprising:
    a voltage controlled oscillator according to claim 3, for generating the modulation signals having their phases shifted by 90 degrees from each other;
    means for modulating the modulation-subject signal by using the modulation signals; and
    means for equalizing a ratio between a frequency of the modulation signals and that of the modulation frequency input to the specified multiple.

9. A quadrature modulator with a modulation frequency input and a modulation-subject signal input, for modulating a signal applied to the modulation-subject signal input by using modulation signals having phases shifted by 90 degrees from each other, at a frequency obtained by multiplying a frequency of a modulation frequency signal by a specified multiple, which is a predetermined rational number, the quadrature modulator comprising:
    a voltage controlled oscillator according to claim 4, for generating the modulation signals having their phases shifted by 90 degrees from each other;
    means for modulating the modulation-subject signal by using the modulation signals; and
    means for equalizing a ratio between a frequency of the modulation signals and that of the modulation frequency input to the specified multiple.

10. A quadrature modulator with a reference frequency input, a modulation-subject signal input, and a modulation frequency specification input, for modulating a signal applied to the modulation-subject signal input by using modulation signals having phases shifted by 90 degrees from each other, at a frequency equal to a frequency obtained by multiplying a frequency of the reference frequency input by a value specified by the modulation frequency specification input, the quadrature modulator comprising:
    a voltage controlled oscillator according to claim 2, for generating the modulation signals having phases shifted by 90 degrees from each other;
    means for modulating the modulation-subject signal by using the modulation signals; and
    means for equalizing a ratio between a frequency of the modulation signals and that of the reference frequency input to the value specified by the modulation frequency specification input.

11. A quadrature modulator with a reference frequency input, a modulation-subject signal input, and a modulation frequency specification input, for modulating a signal applied to the modulation-subject signal input by using modulation signals having phases shifted by 90 degrees from each other, at a frequency equal to a frequency obtained by multiplying a frequency of the reference frequency input by a value specified by the modulation frequency specification input, the quadrature modulator comprising:
    a voltage controlled oscillator according to claim 3, for generating the modulation signals having phases shifted by 90 degrees from each other;
    means for modulating the modulation-subject signal by using the modulation signals; and
    means for equalizing a ratio between a frequency of the modulation signals and that of the reference frequency input to the value specified by the modulation frequency specification input.

12. A quadrature modulator with a reference frequency input, a modulation-subject signal input, and a modulation frequency specification input, for modulating a signal applied to the modulation-subject signal input by using modulation signals having phases shifted by 90 degrees from each other, at a frequency equal to a frequency obtained by multiplying a frequency of the reference frequency input by a value specified by the modulation frequency specification input, the quadrature modulator comprising:
    a voltage controlled oscillator according to claim 4, for generating the modulation signals having phases shifted by 90 degrees from each other;
    means for modulating the modulation-subject signal by using the modulation signals; and
    means for equalizing a ratio between a frequency of the modulation signals and that of the reference frequency input to the value specified by the modulation frequency specification input.

* * * * *